US009607774B2

(12) United States Patent
Kim et al.

(10) Patent No.: US 9,607,774 B2
(45) Date of Patent: Mar. 28, 2017

(54) AMTEC UNIT CELL WITH PARTIALLY OPENED INTERNAL ELECTRODE AND METHOD FOR MANUFACTURING THE AMTEC CELL

(71) Applicant: KOREA INSTITUTE OF ENERGY RESEARCH, Daejeon (KR)

(72) Inventors: Sun-Dong Kim, Daejeon (KR); Se-Young Kim, Seongnam-si (KR); Sang-Kuk Woo, Daejeon (KR); Jong-Hoon Joo, Chungcheongbuk-do (KR); In-Sub Han, Daejeon (KR); Doo-Won Seo, Daejeon (KR); Min-Soo Suh, Daejeon (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 288 days.

(21) Appl. No.: 13/958,671

(22) Filed: Aug. 5, 2013

(65) Prior Publication Data
US 2014/0202513 A1    Jul. 24, 2014

(30) Foreign Application Priority Data

Jan. 22, 2013    (KR) .................. 10-2013-0007046

(51) Int. Cl.
*H01G 9/21*    (2006.01)
*H01G 9/00*    (2006.01)
*H01L 35/32*    (2006.01)

(52) U.S. Cl.
CPC .............. *H01G 9/21* (2013.01); *H01G 9/0029* (2013.01); *H01L 35/32* (2013.01); *Y10T 29/417* (2015.01)

(58) Field of Classification Search
CPC ......... H01M 4/64; H01G 9/21; H01G 9/0029; H01G 9/0036; H01L 35/32
USPC ................... 136/205; 29/825; 429/104, 11
See application file for complete search history.

(56) References Cited

U.S. PATENT DOCUMENTS

| 3,901,733 | A | * | 8/1975 | Toy et al. | 429/320 |
| 5,039,351 | A | * | 8/1991 | Cooper et al. | 136/202 |
| 2002/0157698 | A1 | * | 10/2002 | Itakura et al. | 136/205 |
| 2005/0241690 | A1 | * | 11/2005 | Tajima | H01L 35/10 136/212 |

FOREIGN PATENT DOCUMENTS

KR    10-2011-0135291 A    12/2011

* cited by examiner

*Primary Examiner* — James Lin
*Assistant Examiner* — Dujuan Horton
(74) *Attorney, Agent, or Firm* — Revolution IP, PLLC

(57) ABSTRACT

Disclosed are an open internal electrode AMTEC unit cell, a method for manufacturing the same and a method for connecting circuits. In order to overcome the difficulty in collecting electricity within a conventional AMTEC unit cell, an internal electrode of which a portion is open to the outside, so that the internal electrode and an external electrode can be electrically connected to each other at the outside of the unit cell, and a metal support is used as the internal electrode, so that the internal electrode has durability and stability, and a solid electrolyte is formed in the form of a thin film, and as a result, the AMTEC unit cell has an improved efficiency and a simpler manufacturing process.

10 Claims, 9 Drawing Sheets

AMTEC UNIT CELL WITH PARTIALLY OPENED INTERNAL ELECTRODE AND METHOD FOR MANUFACTURING THE AMTEC CELL

CROSS REFERENCE TO PRIOR APPLICATIONS

This application claims priority under 35 U.S.C. §119 to Korean Patent Application No. 10-2013-0007046, filed on Jan. 22, 2013, which is hereby incorporated by reference in its entirety.

BACKGROUND

Field

The present invention relates to an alkali metal thermal to electric converter (AMTEC) unit cell, and more particularly to an open internal electrode AMTEC unit cell which has an internal electrode of which a portion is open to the outside and thus is capable of connecting the internal electrode to an external electrode at the outside thereof, without directly collecting electricity within the AMTEC unit cell, a method for manufacturing the AMTEC unit cell and an electrically connecting method in the AMTEC unit cell.

Description of Related Art

The development of alkali metal thermal to electric converter (AMTEC) technology has started for the purpose of a power source for space. The AMTEC has a high power density per unit area and high efficiency, and maintains stability. The AMTEC uses a variety of heat sources, for example, solar energy, fossil fuel, waste heat, terrestrial heat, nuclear reactor, etc. The AMTEC is comprised of power generation cells capable of generating electricity without using a driver such as a turbine, a motor or the like, so that it can directly generate electricity from a portion contacting with the heat. When the AMTEC is formed in the form of a module in series or in parallel, a great amount of electricity of several KW to several hundredths MW can be generated. At present, through a technology of collecting the waste heat, the waste heat is collected in the form of heat water, combustion air, etc., by using a heat exchanger, a waste heat boiler or the like. The AMTEC is capable of improving the efficiency by directly generating high-quality electricity. Therefore, the AMTEC is now issued as a promising technology replacing the existing technologies.

The process of generating electricity in the AMTEC will be specifically described. After the state of Na vapor is changed into a vapor state in a high temperature and high pressure evaporator by a heat source, Na+ passes through beta-alumina solid electrolyte (BASE), and free electrons return to an anode through an electric load from a cathode, and then are recombined with ion generated from the surface of a low temperature and low pressure BETA and then is neutralized. Electricity is generated during this process.

The vapor pressure of Na plays the most significant role in a thermal conversion generator as an energy source or a driving force which generates electricity. Also, free electrons generated during a process in which Na passes through the solid electrolyte due to a concentration difference and temperature difference of a working fluid are collected through electrodes, so that electricity can be generated.

The beta-alumina and Na super-ionic conductor (NASI-CON) may be used as the solid electrolyte. The beta-alumina includes two kinds of beta'-alumina and beta"-alumina. The beta"-alumina has a more improved layer structure so that the conductivity of the Na+ ion is much better. Therefore, the beta"-alumina is now generally used.

In the publication of Korean Patent Application No. 10-2011-0135291, disclosed is a unit thermal conversion power generator and a thermal conversion power generation system including: a case including a first end and a second end; a working fluid disposed within the case; a solid electrolyte partitioning the inside of the case; a first electrode disposed on one side of the solid electrolyte; a second electrode disposed on one other side of the solid electrolyte; and a heat source heating alternately the first end and the second end. The invention uses an electric collector for collecting electrons generated from the electrode and the heat source works alternately on the lower and upper ends.

SUMMARY

An electrolyte material for AMTEC is required to have structural stability at a high temperature and to selectively transmit only metal cations. Beta"-alumina solid electrolyte (BASE) ceramic is representatively used as the electrolyte material for AMTEC. Further, research has been conducted to find whether or not Na super-ionic conductor (NASI-CON) popular to have excellent cation conduction is used as a solid electrolyte material for high temperature. However, the NASICON has a problem in its stability of crystal structure when it is exposed to high temperature for a long time.

A BASE tube is an important material that generates electricity by transmitting Na ion. The BASSE tube should a high ionic conductivity, high strength and high durability caused by a dense fine structure. Therefore, it is necessary to select a material having a layer structure allowing the Na ion to pass therethrough and necessary to manufacture the layer structure by using the material. At present, Na-beta-alumina is manufactured and is used in a similar NaS battery.

The AMTEC works at a high temperature and is very corrosive. Also, the AMTEC has various junctions with the shape of tube so that it has a great difficulty in internally collecting electricity. It is difficult not only to collect electricity within the cell without interface loss but also to outward pull a lead wire after collecting the electricity. Particularly, in a general structure of the AMTEC module, since the lower portion of the AMTEC module is formed as a high temperature portion, there is a difficulty. The junction is required to be electrically insulated, so that it is also difficult to pull the lead wire into the penetration surface of a tube of which one end is open.

One aspect of the present invention is an open internal electrode AMTEC unit cell. For the purpose of overcoming the above-mentioned problems, a porous metal tube is manufactured and used as a support and an internal electrode, and a metal filler is filled in a curved portion of the internal electrode, i.e., a portion of the internal electrode, which is opened inward and outward, so that the pores are sealed. A solid electrolyte is coated on the other portions except the curved portion in the form of a thin film, and an external electrode is coated on the solid electrolyte, so that the AMTEC unit cell has durability and a dense fine structure by coating the solid electrolyte layer in the form of a thin film. Furthermore, since a portion of the internal electrode is opened to the outside, the internal electrode and the external electrode can be electrically connected to each other outside the AMTEC unit cell without collecting internally electricity. As a result, it is possible to overcome the difficulty in collecting electricity within a conventional AMTEC unit cell.

In the AMTEC unit cell of the present invention, a tubular porous metal support is used as an internal electrode. Here, a metal filling process is applied to an exposed outward portion of the internal electrode, and a coating process is applied to the other portions of the internal electrode in order to form a solid electrolyte layer on the internal electrode. Also, an external electrode is formed on the solid electrolyte layer. Since the AMTEC unit cell has a structure in which a portion of the internal electrode is open to the outside, it is very easy to collect electricity and the system structure becomes simple. There is no need to connect a wire to the inside of the unit cell. Therefore, problems, e.g., a wire short in the internal collection of electricity, electrical loss caused by the interface, and short-circuit and the like do not occur. Besides, the assembly process such as the junction becomes simpler.

Since the AMTEC unit cell has the metal support, it has durability at a high temperature and a high pressure. In addition, the AMTEC unit cell has a dense fine structure by coating the metal support with the solid electrolyte layer in the form of a thin film through a coating process, so that the efficiency is improved.

DETAILED DESCRIPTION

An open internal electrode AMTEC unit cell according to the present invention, a manufacturing method thereof and an embodiment of a method for connecting circuits will be described with reference to the accompanying drawings.

Figure 1:
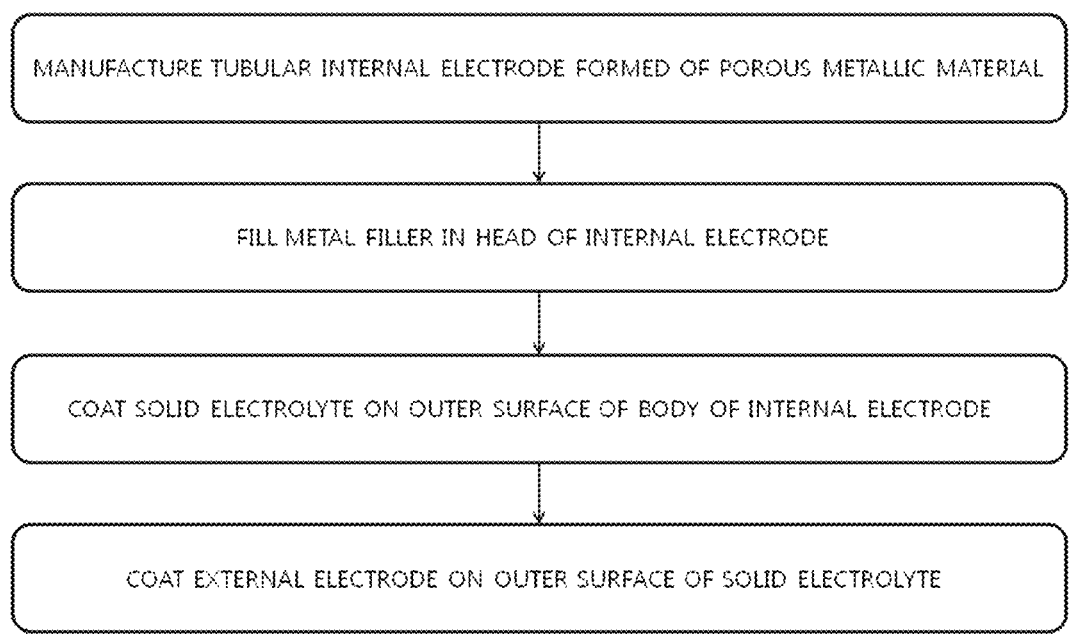
FIG. 1 is a flowchart showing, step-by-step, a method for manufacturing an open internal electrode AMTEC unit cell of the present invention.

FIG. 1 is a flowchart showing, step-by-step, a method for manufacturing an open internal electrode AMTEC unit cell of the present invention. The method for manufacturing the AMTEC unit cell includes: manufacturing a tubular internal electrode 100 including a head 110 which is formed of a porous metallic material and has any one of a hemispherical shape, a semi-elliptical shape and a cylindrical shape having one open side, and a cylindrical body 120 which has both open sides; filling a metal filler in order to seal the pores in the head 110; coating the solid electrolyte 200 on the outer surface of the body 120; and coating an external electrode 300 on the outer surface of the coated portion of the solid electrolyte 200.

Figure 2A:
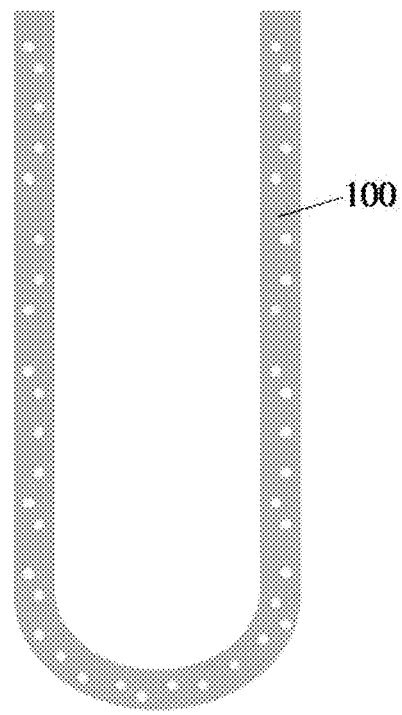
FIGS. 2a-2d are views showing, one-by-one, configurations of the method for manufacturing the open internal electrode AMTEC unit cell of the present invention.

FIG. 2a is a view showing the manufacturing of the tubular internal electrode 100 including the head 110 which is formed of a porous metallic material and has any one of a hemispherical shape, a semi-elliptical shape and a cylindrical shape having one open side, and the cylindrical body 120 which has both open sides. Here, the material of the internal electrode 100 includes at least any one of molybdenum, titanium, tungsten, copper, nickel, nickel-iron alloy, stainless steel, iron and bronze, and is not limited to this.

Figure 2B:
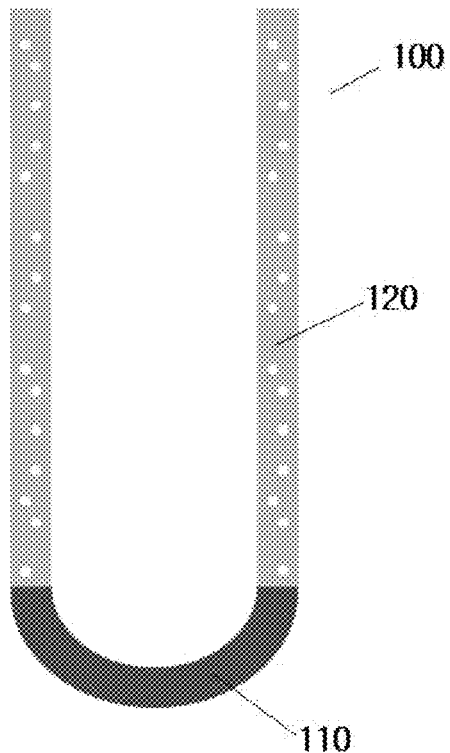

FIG. 2b is a view showing the filling of a metal filler in order to seal the pores in the head 110. The metal filler is filled in the head 110 of the internal electrode 100 by using any one of a metal melt infiltration method and a filler metal method. Here, the metal melt infiltration method is performed by induction heating the metal filler and by filling through brazing. The filler metal method is performed by filling the metal filler through welding. The metal filler may include nickel alloy or titanium alloy. However, the material of the metal filler is not limited to this.

Figure 2C:
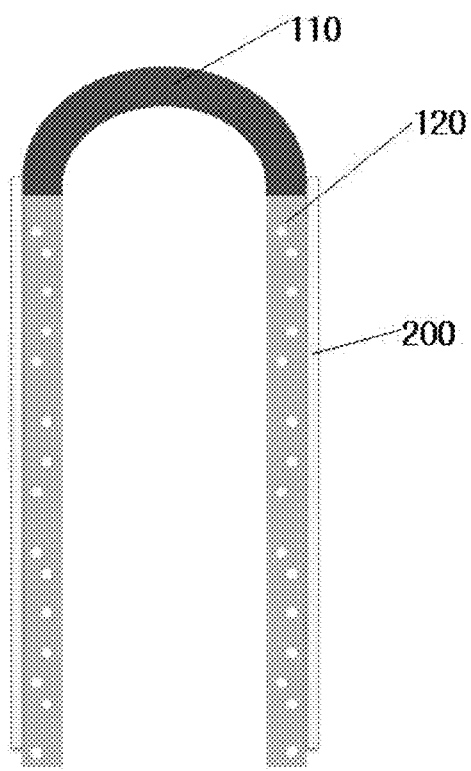

FIG. 2c is a view showing the coating of the solid electrolyte 200 on the outer surface of the body 120. The solid electrolyte 200 is formed of any one of a beta"-alumina based solid electrolyte and a Na super-ionic conductor (NASICON) based solid electrolyte. The solid electrolyte 200 is coated in the form of a thin film by using at least any one of thermal spray coating and plasma coating. However, the coating of the solid electrolyte 200 is not limited to this. Though the solid electrolyte 200 may be coated only on the body of the internal electrode 100, the pores may not be completely sealed at a portion of the boundary of the head 110 of the internal electrode 100 in the actual manufacturing process. Therefore, it is preferable that a portion of the head 110 of the internal electrode 100, which forms a boundary with the body 120, is also coated with the solid electrolyte 200, so that gas is not allowed to pass through the pores around the head 110 of the internal electrode 100. The solid electrolyte can be formed in the form of a thin film to have a dense structure through the coating process, thereby enhancing the power generation efficiency.

Figure 2D:
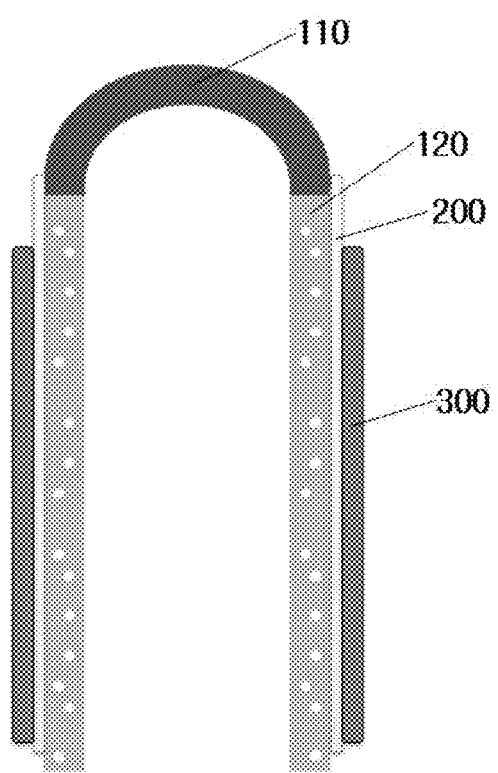

FIG. 2d is a view showing the coating of an external electrode 300 on the outer surface of the coated portion of the solid electrolyte 200. The external electrode 300 may include at least any one of molybdenum, nickel, aluminum, PtW, RhW, TiC, TiN, SiN, RuO, $Ru_2O$ and $Rh_2W$ and is not limited to this.

Figure 3A:
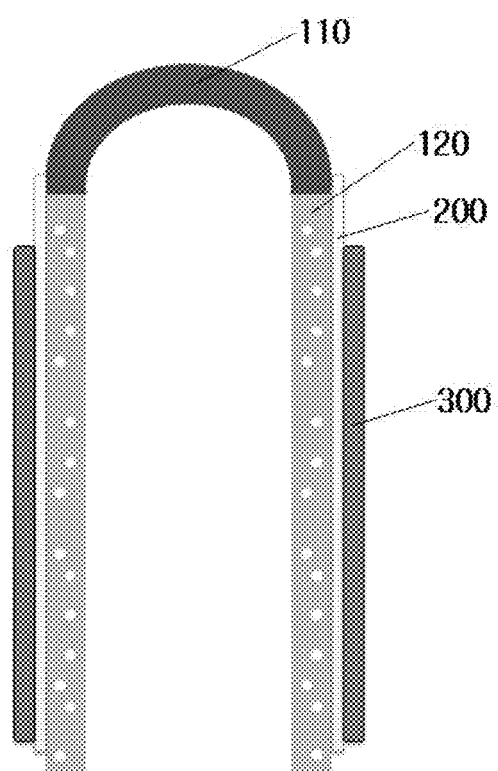
FIGS. 3a-3c are views showing configurations of the open internal electrode AMTEC unit cell of the present invention.
Figure 3B:
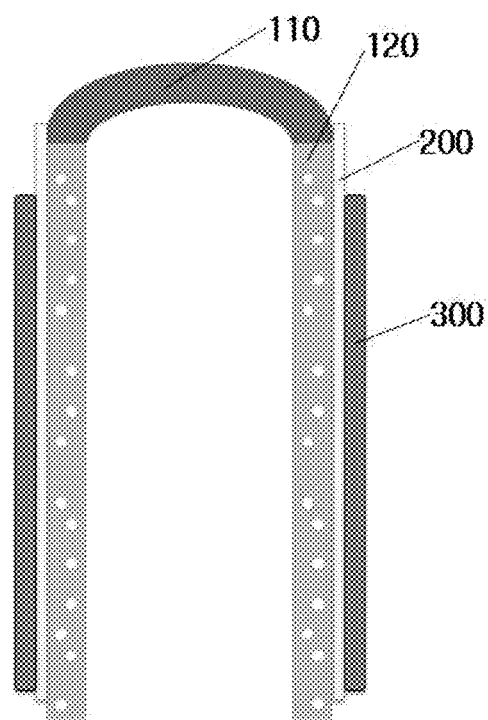
Figure 3C:
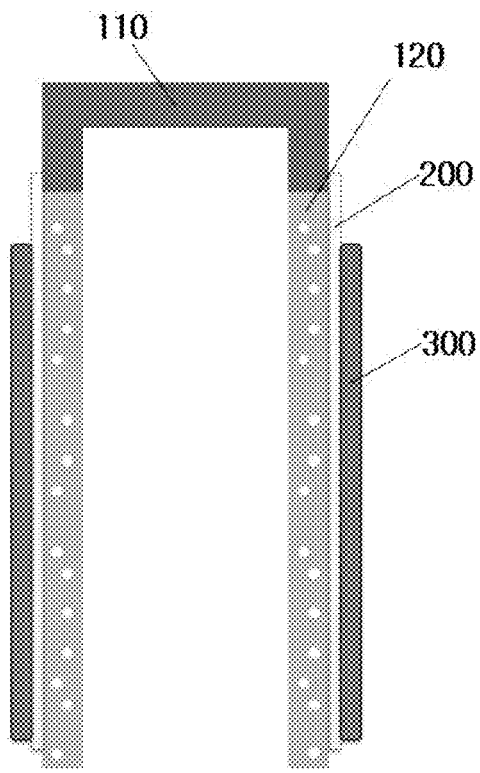

FIG. 3 is a view showing a configuration of the open internal electrode AMTEC unit cell of the present invention. The AMTEC unit cell includes the tubular internal electrode 100 which is formed of a porous metallic material. The internal electrode 100 includes the head 110 and the cylindrical body 120. The head 110 has any one of a hemispherical shape, a semi-elliptical shape and a cylindrical shape having one open side. The cylindrical body 120 has both open sides. The head 110 has the sealed pores, the solid electrolyte 200 formed on the outer surface of the body 120, and the external electrode 300 formed on the solid electrolyte 200. The internal electrode 100 functions as the support of the AMTEC unit cell as well as an electrode. Therefore, the AMTEC unit cell has durability and stability at a high temperature and a high pressure.

Here, the shape of the head 110 of the internal electrode 100 has a hemispherical shape, a semi-elliptical shape and a cylindrical shape having one open side. This is just an example of the internal electrode. It goes without saying that the shape of the head 110 is not limited to this. The material of the internal electrode 100 includes at least any one of molybdenum, titanium, tungsten, copper, nickel, nickel-iron alloy, stainless steel, iron and bronze. The material of the internal electrode 100 may include alloy of them and is not limited to this.

The solid electrolyte 200 is any one of a beta"-alumina based solid electrolyte and a Na super-ionic conductor (NASICON) based solid electrolyte. The solid electrolyte is formed in the form of a thin film and improves the efficiency.

While the external electrode 300 is formed to include at least any one of molybdenum, nickel, aluminum, PtW, RhW, TiC, TiN, SiN, RuO, $Ru_2O$ and $Rh_2W$, the material of the external electrode 300 is not limited to this.

Figure 4:
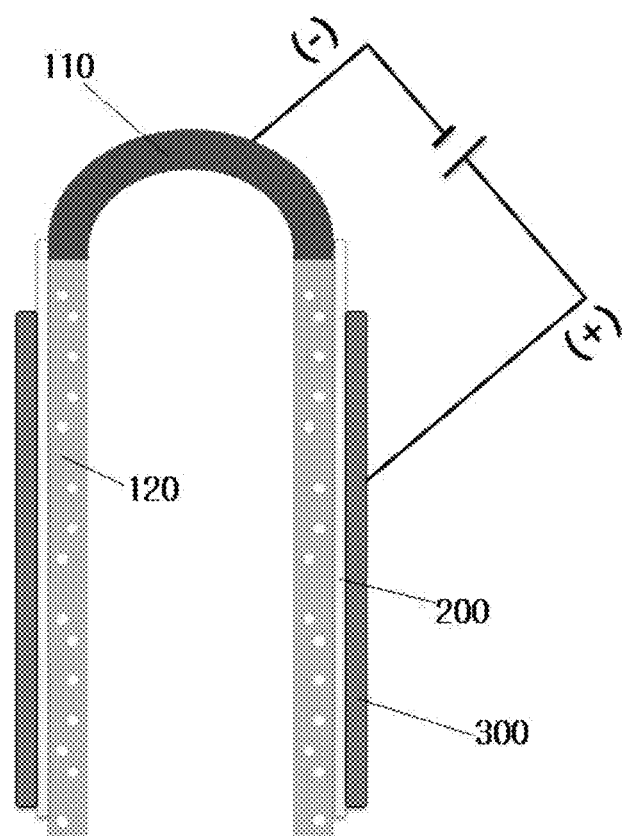
FIG. 4 is a view showing an operating principle in which a circuit is connected by connecting the internal electrode and external electrode of the open internal electrode AMTEC unit cell of the present invention.

FIG. 4 is a view showing an operating principle in which a circuit is connected by connecting the internal electrode 100 and the external electrode 300 of the open internal electrode AMTEC unit cell of the present invention. The circuit can be connected by electrically connecting the external electrode 300 to the outer surface of the head 110 of the internal electrode 100 of the AMTEC unit cell by using a conductor. While the electric connection has been formed by inserting an electric collector within the AMTEC unit cell in the past, electricity can be directly collected outside the AMTEC unit cell in the present invention.

Also, an AMTEC power generator including the AMTEC unit cell can be manufactured. The AMTEC power generator includes a plurality of the open internal electrode AMTEC unit cells; case; a working fluid disposed within the case; a condenser which is disposed on the upper portion of the case and collects and condenses the operating fluid which has passed through the AMTEC unit cell; an evaporator which is disposed on the lower portion of the case and transfers the working fluid vapor; a circulator which connects the space the condenser to the space of the evaporator to thereby allow the working fluid to be transferred; and a joiner which joins the evaporator to the AMTEC unit cell.

The present invention has been described with reference to the accompanying drawings. This is just one of various embodiments including the subject matter of the present invention and intends to allow those skilled in the art to easily embody the present invention. It is clear that the present invention is not limited to the above-described embodiments. Therefore, the scope of the present invention should be construed by the following claims. Without departing from the subject matter of the present invention, all the technical spirits within the scope equivalent to the subject matter of the present invention is included in the right scope of the present invention by the modifications, substitutions, changes and the like. Also, it is clear that some of the drawing configuration are intended for more clearly describing the configuration and are more exaggerated or shortened than the actual one.

What is claimed is:

1. A method for manufacturing an open internal electrode AMTEC unit cell, the method comprising:
   (i) manufacturing a tubular internal electrode comprising a head and a cylindrical body, wherein,
      the tubular internal electrode is formed of a porous metallic material having pores located at the head and the cylindrical body,
      the head has a convex shape which is exposed to an outside of the tubular internal electrode, the exposed head collects electricity without a wire, and
      the cylindrical body has both open sides;
   (ii) filling a metal filler into the pores located at the head for sealing;
   (iii) coating a solid electrolyte on the outer surface of the cylindrical body except for the exposed head; and
   (iv) coating an external electrode on the outer surface of the coated portion of the solid electrolyte.

2. The method of claim 1, wherein a material of the internal electrode of step (i) comprises at least any one of molybdenum, titanium, tungsten, copper, nickel, nickel-iron alloy, stainless steel, iron and bronze.

3. The method of claim 1, wherein, in step (ii), the metal filler is filled in the head of the internal electrode by using any one of a metal melt infiltration method and a filler metal method.

4. The method of claim 1, wherein, in step (iii), the solid electrolyte is formed of any one of a beta"-alumina based solid electrolyte and a Na super-ionic conductor (NASICON) based solid electrolyte.

5. The method of claim 1, wherein, in step (iii), the solid electrolyte is coated in the form of a thin film by using at least any one of thermal spray coating and plasma coating.

6. The method of claim 1, wherein, in step (iv), the external electrode comprises at least any one of molybdenum, nickel, aluminum, PtW, RhW, TiC, TiN, SiN, RuO, $Ru_2O$ and $Rh_2W$.

7. An open internal electrode AMTEC unit cell comprising:
   a tubular internal electrode comprising a head and a cylindrical body, wherein,
   the tubular internal electrode is formed of a porous metallic material having pores located at the head and the cylindrical body,
   the head has a convex shape which is exposed to an outside of the tubular internal electrode, the exposed head collects electricity without a wire, and
   the cylindrical body has both open sides,
   wherein a metal filler is filled into the pores located at the head for sealing so that gas is not allowed to pass through the head,
   a solid electrolyte formed on the outer surface of the cylindrical body except for the exposed head; and
   an external electrode formed on the solid electrolyte.

8. The open internal electrode AMTEC unit cell of claim 7, wherein a material of the internal electrode comprises at least any one of molybdenum, titanium, tungsten, copper, nickel, nickel-iron alloy, stainless steel, iron and bronze.

9. The open internal electrode AMTEC unit cell of claim 7, wherein the solid electrolyte is any one of a beta"-alumina based solid electrolyte and a Na super-ionic conductor (NASICON) based solid electrolyte, and wherein the solid electrolyte is formed in the form of a thin film.

10. The open internal electrode AMTEC unit cell of claim 7, wherein the external electrode is formed to comprise at least any one of molybdenum, nickel, aluminum, PtW, RhW, TiC, TiN, SiN, RuO, $Ru_2O$ and $Rh_2W$.

* * * * *